United States Patent
Ahn

(10) Patent No.: US 8,946,008 B2
(45) Date of Patent: Feb. 3, 2015

(54) ORGANIC LIGHT EMITTING DIODE DISPLAY, THIN FILM TRANSITOR ARRAY PANEL, AND METHOD OF MANUFACTURING THE SAME

(71) Applicant: Ki-Wan Ahn, Yongin (KR)

(72) Inventor: Ki-Wan Ahn, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/897,745

(22) Filed: May 20, 2013

(65) Prior Publication Data

US 2014/0117323 A1     May 1, 2014

(30) Foreign Application Priority Data

Oct. 29, 2012   (KR) .......................... 10-2012-0120717

(51) Int. Cl.

| | | |
|---|---|---|
| *H01L 29/66* | (2006.01) | |
| *H01L 29/786* | (2006.01) | |
| *H01L 51/52* | (2006.01) | |
| *H01L 27/12* | (2006.01) | |

(52) U.S. Cl.
CPC ............ *H01L 51/52* (2013.01); *H01L 27/1288* (2013.01)
USPC ....................................................... 438/151

(58) Field of Classification Search
CPC ............ H01L 27/1214; H01L 27/1288; H01L 21/31144; H01L 2227/323; H01L 27/3262; H01L 29/4908; H01L 21/308; H01L 21/32139; H01L 29/41733; H01L 29/786
USPC ................................. 438/34, 151; 257/40, 66
See application file for complete search history.

(56) References Cited

U.S. PATENT DOCUMENTS

2012/0107982 A1 *   5/2012   Song et al. ...................... 438/30

FOREIGN PATENT DOCUMENTS

| KR | 10-2004-0087978 A | 10/2004 |
|---|---|---|
| KR | 10-2010-0097002 A | 9/2010 |
| KR | 10-2012-0053770 A | 5/2012 |
| KR | 10-2012-0075803 A | 7/2012 |

* cited by examiner

*Primary Examiner* — Whitney T Moore
(74) *Attorney, Agent, or Firm* — Lee & Morse, P.C.

(57) ABSTRACT

A thin film transistor array panel includes a substrate, a semiconductor that is positioned on the substrate and that has a source area, a drain area, and a channel area, a gate insulating layer that is positioned on the semiconductor, a gate electrode that is positioned on the gate insulating layer and that overlaps the channel area, a first interlayer insulating layer that is positioned on the gate electrode and that has contact holes that expose the source area and the drain area, respectively, of which the source area and the drain area have a same plane pattern as that of the contact holes, and a source electrode and a drain electrode that are positioned on the first interlayer insulating layer and that are connected to the source area and the drain area, through the contact holes, respectively.

6 Claims, 11 Drawing Sheets

ORGANIC LIGHT EMITTING DIODE DISPLAY, THIN FILM TRANSITOR ARRAY PANEL, AND METHOD OF MANUFACTURING THE SAME

CROSS-REFERENCE TO RELATED APPLICATION

This application claims priority under 35 U.S.C. §119 to Korean Patent Application No. 10-2012-0120717, and entitled: "Organic Light Emitting Diode Display, Thin Film Transistor Array Panel, and Method of Manufacturing the Same," filed in the Korean Intellectual Property Office on Oct. 29, 2012, the entire contents of which are incorporated herein by reference.

BACKGROUND

An organic light emitting diode (OLED) display is a self-luminescent display for displaying an image with OLEDs that emit light. Because the OLED display does not require a separate light source, unlike a liquid crystal display (LCD), the OLED display may have a relatively reduced thickness and weight. Further, the OLED display represents high quality characteristics of lower power consumption, high luminance, and a rapid reaction speed, and thus has been in the spotlight as a next generation display device of a portable electronic device.

The OLED displays are classified into a passive matrix type and an active matrix type according to a driving method. The active matrix type OLED display may include an OLED, a thin film transistor (TFT), and a capacitor, which are formed in each pixel and independently controls the pixel. Such an OLED display may be manufactured using a photolithography process that uses a plurality of masks according to a structure. However, as the number of times of mask processes increases, a process time and a process production cost also increase.

The above information disclosed in this Background section is only for enhancement of understanding of the background of the described technology and therefore it may contain information that does not form the prior art that is already known in this country to a person of ordinary skill in the art.

SUMMARY

Embodiments may be realized by providing a substrate, a semiconductor that is positioned on the substrate and that has a source area, a drain area, and a channel area, a gate insulating layer that is positioned on the semiconductor, a gate electrode that is positioned on the gate insulating layer and that overlaps with the channel area, a first interlayer insulating layer that is positioned on the gate electrode and that has a contact hole that exposes each of the source area and the drain area, and a source electrode and a drain electrode that are positioned on the first interlayer insulating layer and that are connected to the source area and the drain area, respectively, through a contact hole. The source area and the drain area have the same plane pattern as that of the contact hole.

The TFT array panel may further include offset areas that are each positioned between the source area and the channel area and between the drain area and the channel area. The gate insulating layer may have the same plane pattern as that of the semiconductor.

The TFT array panel may further include: a second interlayer insulating layer that is positioned on the source electrode and the drain electrode and that has a contact hole that exposes the drain electrode; and a first electrode that is positioned on the second interlayer insulating layer and that is connected to the drain electrode through the contact hole of the second interlayer insulating layer.

Embodiments may also be realized by providing a substrate, a first signal line that is positioned on the substrate; a first TFT that is connected to the first signal line, a second TFT that is connected to the first TFT, an interlayer insulating layer that is positioned on the first TFT and the second TFT, a second signal line that is positioned on the interlayer insulating layer and that is connected to a first source area of the first TFT, a first drain electrode that is connected to a gate electrode of the second TFT, a third signal line that is connected to a second source area of the second TFT, and a second drain electrode that is connected to a drain area of the second TFT, a first electrode that is electrically connected to the second drain electrode; an organic emission layer that is positioned on the first electrode, and a second electrode that is positioned on the organic emission layer. The first source area and the second signal line, the second source area and the third signal line, the first drain area and the first drain electrode, and the second drain area and the second drain electrode are connected through a contact hole that is formed in the interlayer insulating layer, and the contact hole has the same plane pattern as that of the first source area and the second source area.

The gate insulating layer may have the same plane pattern as that of the semiconductor. The OLED display may further include offset areas that are each positioned between the source area and the channel area and between the drain area and the channel area.

Embodiments may also be realized by providing a method of manufacturing a TFT array panel that includes stacking a polysilicon layer, an insulating layer, and a metal layer on a substrate, forming a photosensitive film pattern having a first portion and a second portion having a thickness smaller than that of the first portion on the metal layer, forming a metal pattern, a gate insulating layer, and a semiconductor by etching the metal layer, the insulating layer, and the polysilicon layer using the photosensitive film pattern as a mask, forming a gate electrode by removing a second portion of the photosensitive film pattern and by etching the metal pattern using the first portion as a mask; removing the first portion of the photosensitive film pattern, forming an interlayer insulating layer on the gate electrode, forming a contact hole that exposes the semiconductor in the interlayer insulating layer, forming a source area and a drain area by doping semiconductor conductive impurities through the contact hole, and forming a source electrode and a drain electrode that are connected to the source area and the drain area, respectively, on the interlayer insulating layer.

Embodiments may also be realized by providing a method of manufacturing a TFT array panel that includes stacking a polysilicon layer, an insulating layer, and a metal layer on a substrate, forming a photosensitive film pattern having a first portion and a second portion having a thickness smaller than that of the first portion on the metal layer, forming a metal pattern, a gate insulating layer, and a semiconductor by etching the metal layer, the insulating layer, and the polysilicon layer using the photosensitive film pattern as a mask, forming a gate electrode by removing a second portion of the photosensitive film pattern and by etching the metal pattern using the first portion of the photosensitive film pattern as a mask, removing the first portion of the photosensitive film pattern, forming an interlayer insulating layer on the gate electrode, forming a contact hole that exposes the semiconductor in the interlayer insulating layer, and forming a source electrode and a drain electrode that are connected to the source area and the drain area, respectively, on the interlayer insulating layer. Before or after the removing of the first portion, the method further includes doping conductive impurities in the semiconductor.

At the forming of a metal pattern, the metal layer may be wet etched, and the insulating layer and the polysilicon layer may be dry etched. The metal layer may be formed in a triple layer of Ti/Al/Ti, wherein at the forming of a metal pattern, the metal layer, the insulating layer, and the polysilicon layer may be dry etched.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
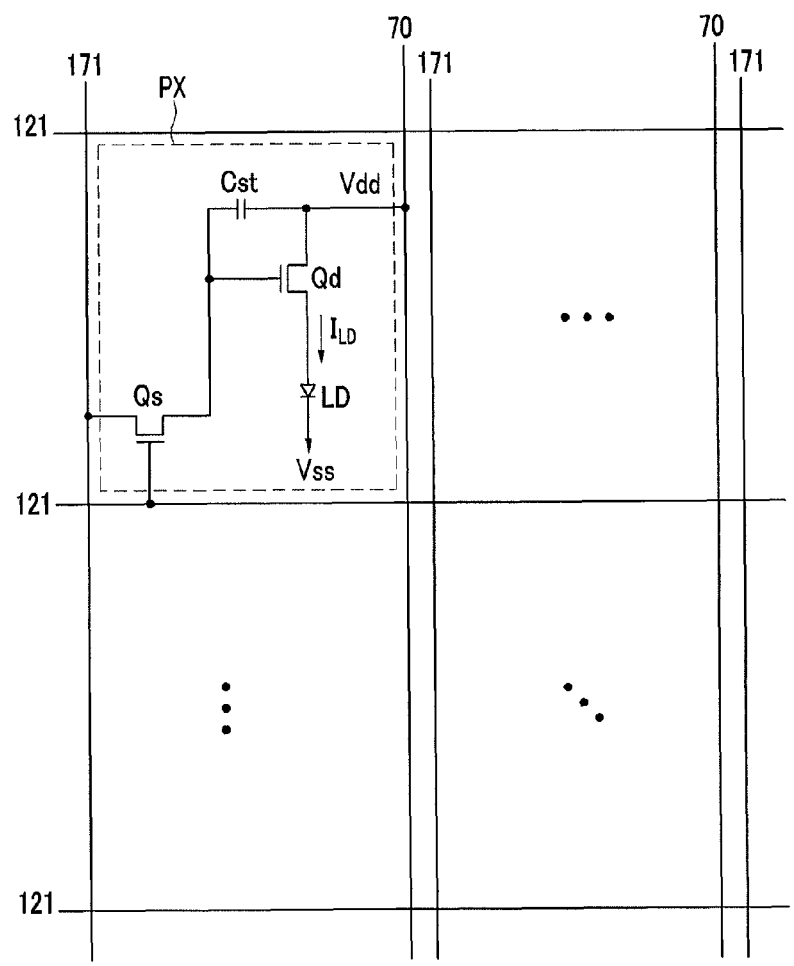
FIG. 1 is a circuit diagram illustrating a pixel circuit of an OLED display according to an exemplary embodiment.

Embodiments will be described more fully hereinafter with reference to the accompanying drawings, in which exemplary embodiments are shown. As those skilled in the art would realize, the described embodiments may be modified in various different ways, all without departing from the spirit or scope of the embodiments.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an OLED display according to an exemplary embodiment will be described in detail with reference to the drawings.

FIG. 1 is a circuit diagram illustrating a pixel circuit of an OLED display according to an exemplary embodiment.

As shown in FIG. 1, the OLED display according to an exemplary embodiment includes a plurality of signal lines 121, 171, 70 and a plurality of pixels PX that are connected thereto and that are arranged in an approximately matrix form.

The signal lines include a plurality of gate lines 121 that transfer a gate signal (or a scan signal), a plurality of data lines 171 that transfer a data signal, and a plurality of driving voltage lines 70 that transfer a driving voltage Vdd. The gate lines 121 extend in an approximately row direction and are substantially parallel to each other, and vertical direction portions of the data line 171 and the driving voltage line 70 extend in an approximately column direction and are substantially parallel to each other.

Each pixel PX includes a switching TFT Qs, a driving TFT Qd, a storage capacitor Cst, and an OLED LD.

The switching TFT Qs has a control terminal, an input terminal, and an output terminal, of which the control terminal is connected to the gate line 121, the input terminal is connected to the data line 171, and the output terminal is connected to the driving TFT Qd. The switching TFT Qs transfers a data signal that is applied to the data line 171 to the driving TFT Qd in response to a scan signal that is applied to the gate line 121.

The driving TFT Qd has a control terminal, an input terminal, and an output terminal, of which the control terminal is connected to the switching TFT Qs, the input terminal is connected to the driving voltage line 70, and the output terminal is connected to the OLED LD. The driving TFT Qd enables an output current $I_{LD}$ having a changing magnitude to flow according to a voltage that is applied between the control terminal and the output terminal.

The capacitor Cst is connected between the control terminal and the input terminal of the driving TFT Qd. The capacitor Cst charges a data signal that is applied to the control terminal of the driving TFT Qd and sustains this state even after the switching TFT Qs is turned off.

The OLED LD has an anode that is connected to the output terminal of the driving TFT Qd and a cathode that is connected to a common voltage Vss. The OLED LD emits light with a different intensity according to the output current $I_{LD}$ of the driving TFT Qd, thereby displaying an image.

The switching TFT Qs and the driving TFT Qd are an n-channel field effect transistor (FET). However, at least one of the switching TFT Qs and the driving TFT Qd may be a p-channel FET. Further, a connection relationship of the TFTs Qs and Qd, the capacitor Cst, and the OLED LD may be changed.

Hereinafter, an OLED display according to an exemplary embodiment will be described in detail with reference to FIGS. 2 and 3.

Figure 2:
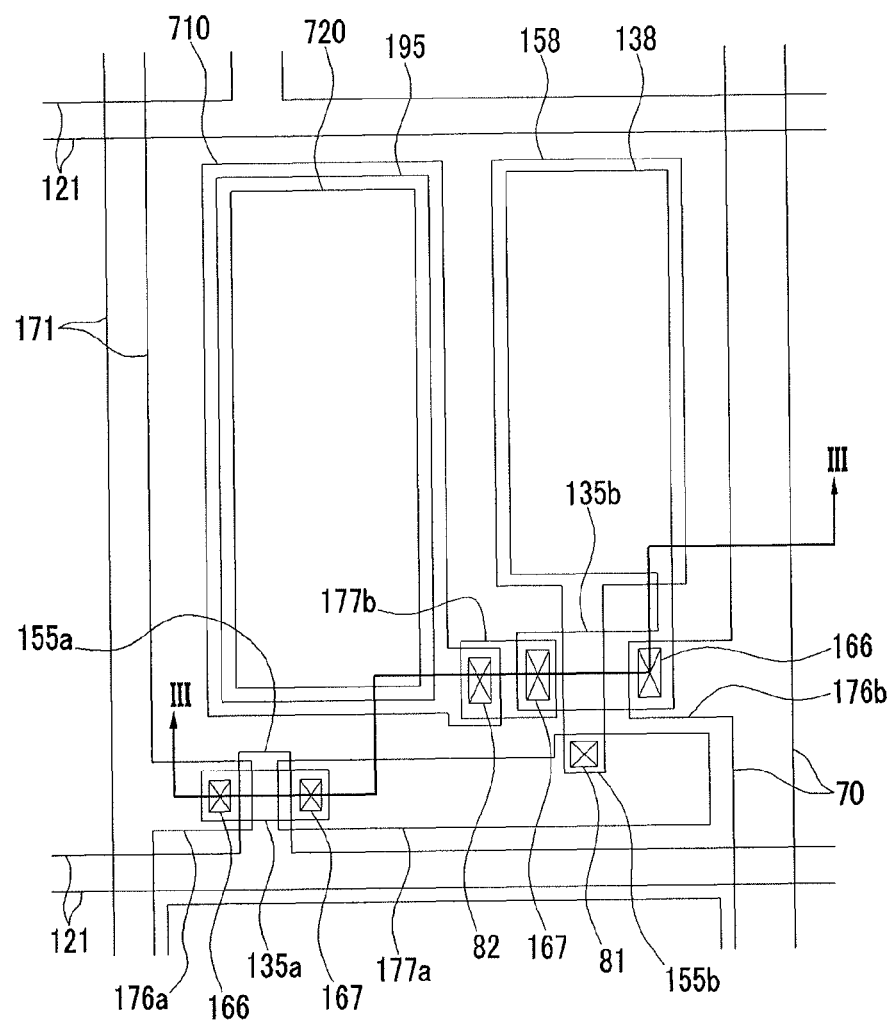
FIG. 2 is a layout view illustrating a pixel of the OLED display of FIG. 1.
Figure 3:
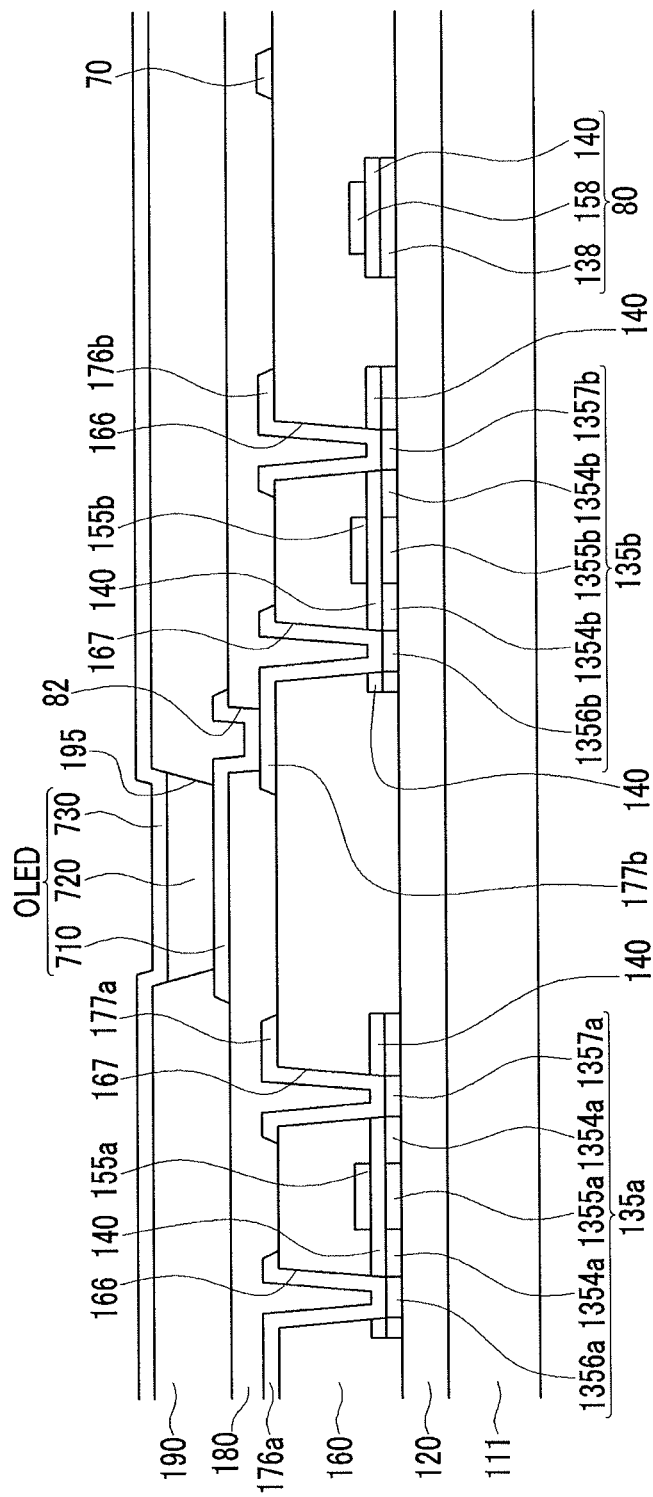
FIG. 3 is a cross-sectional view illustrating the pixel taken along line of FIG. 2.

FIG. 2 is a layout view illustrating a pixel of the OLED display of FIG. 1, and FIG. 3 is a cross-sectional view illustrating the pixel taken along line of FIG. 2.

As shown in FIGS. 2 and 3, a buffer layer 120 is formed on a substrate 111. The substrate 111 may be an insulating substrate that is made of, e.g., glass, quartz, ceramic, or plastic. The substrate 111 may be a metallic substrate that is made of, e.g., stainless steel.

The buffer layer 120 may be formed in a structure of a single layer of silicon nitride ($SiN_x$) or a dual layer that is stacked with silicon nitride ($SiN_x$) and silicon oxide ($SiO_2$). The buffer layer 120 performs a function of planarizing a surface while reducing the possibility of and/or preventing permeation of an unnecessary component such as impurities or moisture.

On the buffer layer 120, a first semiconductor 135a and a second semiconductor 135b, e.g., that are made of polysilicon, and a first capacitor electrode 138 are formed.

The first semiconductor 135a and the second semiconductor 135b are divided into channel areas 1355a and 1355b and source areas 1356a and 1356b and drain areas 1357a and 1357b that are each formed at both sides of the channel areas 1355a and 1355b. The channel areas 1355a and 1355b of the first semiconductor 135a and the second semiconductor 135b may be polysilicon that is not doped with impurities, i.e., an intrinsic semiconductor. The source areas 1356a and 1356b and the drain areas 1357a and 1357b of the first semiconductor 135a and the second semiconductor 135b may be polysilicon that is doped with conductive impurities, i.e., an impurity semiconductor.

Impurities that are doped in the source areas 1356a and 1356b, the drain areas 1357a and 1357b, and the first capacitor electrode 138 may be one of a p-type impurity and an n-type impurity.

A gate insulating layer 140 is formed on the first semiconductor 135a, the second semiconductor 135b, and the first capacitor electrode 138. The gate insulating layer 140 may be a single layer or a plurality of layers including at least one of selected from the group of tetra ethyl ortho silicate (TEOS), silicon nitride, and silicon oxide.

The gate insulating layer 140 is formed in the same shape as that of a plane pattern of the first semiconductor 135a, the second semiconductor 135b, and the first capacitor electrode 138. On the gate insulating layer 140, the gate line 121, a second gate electrode 155b, and a second capacitor electrode 158 are formed.

The gate line 121 include a first gate electrode 155a that long extends in a horizontal direction to transfer a gate signal and that is protruded from the gate line 121 to the first semiconductor 135a.

The first gate electrode 155a and the second gate electrode 155b overlap with the channel areas 1355a and 1355b, respectively, and the second capacitor electrode 158 overlaps with the first capacitor electrode 138.

The second capacitor electrode 158, the gate line 121, and the second gate electrode 155b are formed in a single layer or a plurality of layers with Mo, W, Cu, Al or alloys thereof.

The first capacitor electrode 138 and the second capacitor electrode 158 form a capacitor 80 using the gate insulating layer 140 as a dielectric material. The capacitor 80 forms a capacitor of an MIM form in a separate metal pattern that is overlapped with an insulating layer and the second capacitor electrode 158 instead of the first capacitor electrode 138 interposed therebetween. For example, the capacitor 80 may be formed by overlapping a metal pattern that is formed in the same layer as that of the drain electrode or the first electrode using the second capacitor electrode 158 and a first interlayer insulating layer or a second interlayer insulating layer to be described later as a dielectric material.

A first interlayer insulating layer 160 is formed on the gate line 121, the first gate electrode 155a, the second gate electrode 155b, and the second capacitor electrode 158. The first interlayer insulating layer 160 is formed in a single layer or a plurality of layers, e.g., with tetra ethyl ortho silicate (TEOS), silicon nitride, or silicon oxide, as in the gate insulating layer 140.

The first interlayer insulating layer 160 and the gate insulating layer 140 have source contact holes 166 and drain contact holes 167 that expose the source areas 1356a and 1356b and the drain areas 1357a and 1357b, respectively.

A plane pattern of the source areas 1356a and 1356b and the drain areas 1357a and 1357b is the same as that of the source contact hole 166 and the drain contact hole 167. In this regard, a boundary line of the source areas 1356a and 1356b and the drain areas 1357a and 1357b corresponds with a boundary line of the source contact hole 166 and the drain contact hole 167 or positions (e.g., of bottom most surfaces of electrodes within the source control hole 166 and the drain contact hole 167) within a boundary line of the source contact hole 166 and the drain contact hole 167. For example, the source areas 1356a and 1356b and the drain areas 1357a and 1357b and the bottom surfaces of the source contact hole 166 and the drain contact hole 167 may be aligned with each other.

On the first interlayer insulating layer 160, the data line 171 having the first source electrode 176a, the driving voltage line 70, a first drain electrode 177a, and a second drain electrode 177b, and the second source electrode 176b are formed.

The data line 171 transfers a data signal, extends to intersect the gate line 121, and the driving voltage line 70 transfers a predetermined voltage, is separated from the data line 171, and extends in the same direction as that of the data line 171.

The first source electrode 176a is protruded from the data line 171 toward the first semiconductor 135a, and the second source electrode 176b is protruded from the driving voltage line 70 toward the second semiconductor 135b. The first source electrode 176a and the second source electrode 176b are connected to the source areas 1356a and 1356b, respectively, through the source contact hole 166.

The first drain electrode 177a is opposite to the first source electrode 176a and is connected to the drain area 1357a through the contact hole 167. The second drain electrode 177b is opposite to the first source electrode 176b and is connected to the drain area 1357b through the contact hole 167.

The first drain electrode 177a extends along, e.g., parallel to, the gate line 121 and is electrically connected to the second gate electrode 155b through the contact hole 167.

The data line 171, the driving voltage line 70, the first drain electrode 177a, and the second drain electrode 177b are formed in a single layer or a plurality of layers with a low resistance material or a material strong on corrosion like Al, Ti, Mo, Cu, Ni, or alloys thereof. For example, the data line 171, the driving voltage line 70, the first drain electrode 177a, and the second drain electrode 177b may be a triple layer of Ti/Cu/Ti, Ti/Ag/Ti, or Mo/Al/Mo.

The first gate electrode 155a, the first source electrode 176a, and the first drain electrode 177a each form a first TFT Qa together with the first semiconductor 135a, and the second gate electrode 155b, the second source electrode 176b, and the second drain electrode 177b each form a second TFT Qb together with a second semiconductor 135b.

Channels of the first TFT Qa and the second TFT Qb are each formed in the first semiconductor 135a between the first source electrode 176a and the first drain electrode 177a and the second semiconductor 135b between the second source electrode 176b and the second drain electrode 177b.

The first semiconductor 135a and the second semiconductor 135b have an offset area. The offset area is positioned between a source area and a channel area and between a drain area and a channel area. When a TFT is in an off state, the offset area blocks an electron moving path of a semiconductor, thereby reducing the possibility of and/or preventing a leakage current.

When a width of the offset area is so small, a leakage current prevention effect cannot be obtained, and when a width of the offset area is so large, a channel may not be formed. According to an exemplary embodiment, a width of the offset area may be about 2 μm or less and/or the offset area may be about 2 μm.

A second interlayer insulating layer 180 is formed on the data line 171, the driving voltage line 70, the first drain electrode 177a, and the second drain electrode 177b.

The second interlayer insulating layer 180 may be formed in a single layer or a plurality of layers, e.g., with TEOS, silicon nitride, or silicon oxide, and may be made of a low dielectric constant organic material, as in the first interlayer insulating layer.

In the second interlayer insulating layer 180, a contact hole 82 that exposes the second drain electrode 177b is formed.

A first electrode 710 is formed on the second interlayer insulating layer 180. The first electrode 710 may be an anode of the OLED of FIG. 1. In an exemplary embodiment, an interlayer insulating layer is formed between the first electrode 710 and the second drain electrode 177b, but the first electrode 710 may be formed in the same layer as that of the second drain electrode 177b and may be integrally formed with the second drain electrode 177b.

A pixel defining layer 190 is formed on the first electrode 710.

The pixel defining layer 190 has an opening 195 that exposes the first electrode 710. The pixel defining layer 190 includes, e.g., a polyacrylates or polyimides resin and a silica-based inorganic material.

An organic emission layer 720 is formed in the opening 195 of the pixel defining layer 190.

The organic emission layer 720 may be formed in a plurality of layers including at least one of an emission layer, a hole-injection layer (HIL), a hole-transporting layer (HTL), an electron-transporting layer (ETL), and an electron-injection layer (EIL).

When the organic emission layer 720 includes all of the emission layer, the HIL, the HTL, the ETL, and the EIL, the HIL positions on the pixel electrode 710, which is an anode, and the HTL, the emission layer, the ETL, and the EIL are sequentially stacked on the pixel electrode 710.

A common electrode 730 is formed on the pixel defining layer 190 and the organic emission layer 720.

The common electrode 730 becomes a cathode of the OLED. Therefore, the pixel electrode 710, the organic emission layer 720, and the common electrode 730 constitute the OLED.

The OLED display may have any one structure of a front surface display type, a rear surface display type, and a both surface display type according to a light emission direction of the OLED.

When the OLED display is a front surface display type, the first electrode 710 is formed in a reflective layer, and the common electrode 730 is formed in a transflective layer or a transmissive layer. When the OLED display is a rear surface display type, the pixel electrode 710 is formed in a transflective layer, and the common electrode 730 is formed in a reflective layer. When the OLED display is a both surface display type, the pixel electrode 710 and the common electrode 730 are formed in a transparent layer or a transflective layer.

The reflective layer and the transflective layer are formed using at least one selected from the group of metal or alloys of magnesium (Mg), silver (Ag), gold (Au), calcium (Ca), lithium (Li), chromium (Cr), and aluminum (Al). The reflective layer and the transflective layer are determined by a thickness, and the transflective layer may be formed in a thickness of 200 nm or less. When the reflective layer and the transflective layer have a small thickness, a transmittance of light increases, but when the reflective layer and the transflective layer have a very small thickness, resistance increases.

The transparent layer is made of, e.g., a material such as indium tin oxide (ITO), indium zinc oxide (IZO), zinc oxide (ZnO), or indium oxide (In$_2$O$_3$).

Hereinafter, a method of manufacturing the OLED display will be described in detail with reference to FIGS. 4 to 8 and FIGS. 2 and 3.

FIGS. 4 to 8 are cross-sectional views sequentially illustrating a process of a method of manufacturing an OLED display according to an exemplary embodiment.

Figure 4:
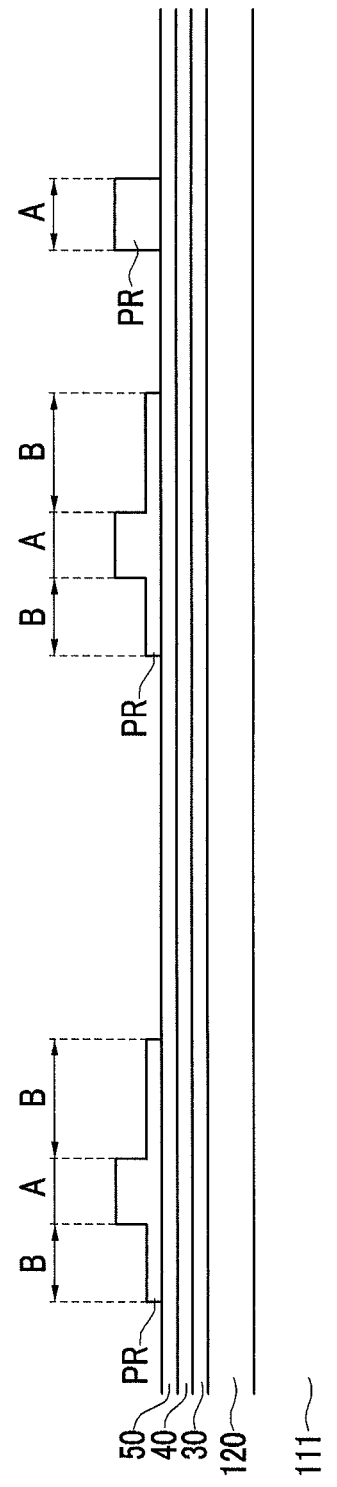
FIGS. 4 to 8 are cross-sectional views sequentially illustrating a process of a method of manufacturing an OLED display according to an exemplary embodiment.

First, as shown in FIG. 4, the buffer layer 120 is formed on the substrate 111. The buffer layer 120 is made of, e.g., silicon nitride or silicon oxide.

By forming and crystallizing an amorphous silicon layer on the buffer layer 120, a polysilicon layer 30 is formed, and an insulating layer 40 and a metal layer 50 are stacked on the polysilicon layer 30.

The insulating layer 40 is made of, e.g., silicon nitride or silicon oxide.

The metal layer 50 is formed by stacking W, Cu, Al or alloys thereof in a single layer or a plurality of layers. Thereafter, by applying, exposing, and developing a photosensitive material on the metal layer 50, a photosensitive film pattern PR having different thicknesses is formed. The photosensitive film pattern includes an electrode portion corresponding to a metal layer, an insulating layer, and a polysilicon layer of an electrode area A in which a gate electrode is to be formed and the remaining portion corresponding to the remaining area B, except for the electrode portion.

In the photosensitive film pattern PR, a photosensitive film pattern PR that is positioned at an electrode area A has a thickness larger than a photosensitive film pattern that is positioned at the remaining area B.

In this way, various methods of differently forming a thickness of the photosensitive film pattern according to a position may exist, and a method of forming a transparent area, a light blocking area, and a semi-transparent area in an exposure mask is an example. In the semi-transparent area, a thin film having a slit pattern, a lattice pattern, or an intermediate transmittance, or an intermediate thickness is provided. When the slit pattern is used, a width of a slit or a gap between slits may be smaller than a resolution of an exposer that is used in a photolithography process. Another example is to use a photosensitive film in which reflow is available. That is, after forming a photosensitive pattern film in which reflow is available with a common mask having only a transparent area and a light blocking area, by enabling the photosensitive film to flow by reflow to an area in which a photosensitive film does not remain, a thin portion is formed.

Figure 5:
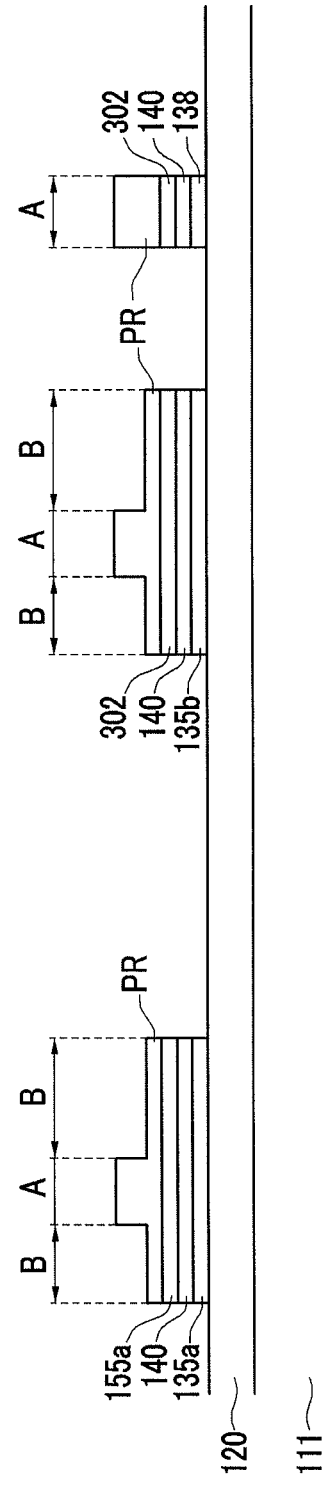

Next, as shown in FIG. 5, by etching the metal layer 50, the insulating layer 40, and the polysilicon layer 30 using the photosensitive film pattern PR as a mask, a metal pattern 302, the gate insulating layer 140, the first semiconductor 135a, the second semiconductor 135b, and the first capacitor electrode 138 are formed.

The metal layer 50 is etched by wet etching, and the insulating layer 40 and the polysilicon layer 30 are etched by dry etching. For example, when the metal layer 50 is formed in a single layer or a plurality of layers including Ti or Al that can perform dry etching, the metal layer 50, the insulating layer 40, and the polysilicon layer 30 are etched at one time by dry etching.

Figure 6:
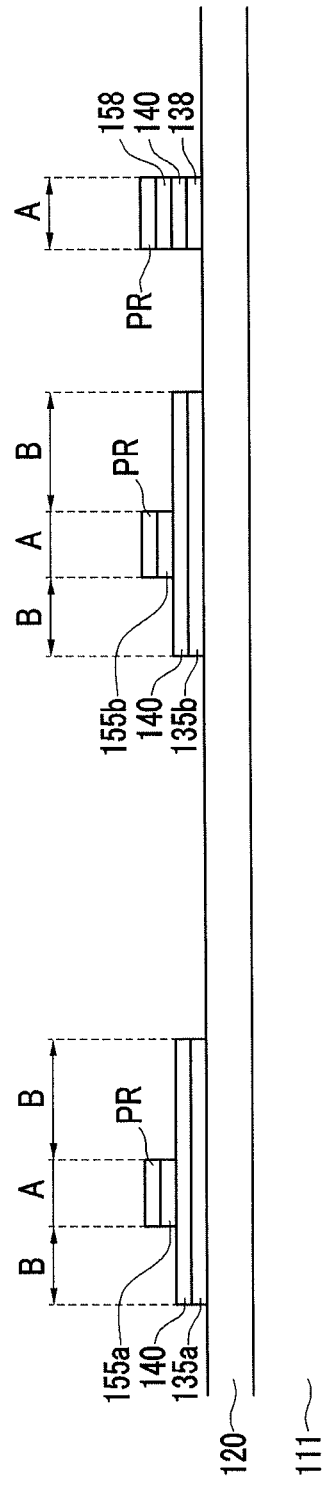

Next, as shown in FIG. 6, the remaining portion B of the photosensitive film pattern is removed by a method such as etch back. For example, the electrode portion A is partially removed and thus a thickness and a width of the photosensitive film pattern PR is decreased.

Thereafter, by etching a metal pattern using the electrode portion A as a mask, the first gate electrode 155a, the second gate electrode 155b, and the second capacitor electrode 158 are formed.

Figure 7:
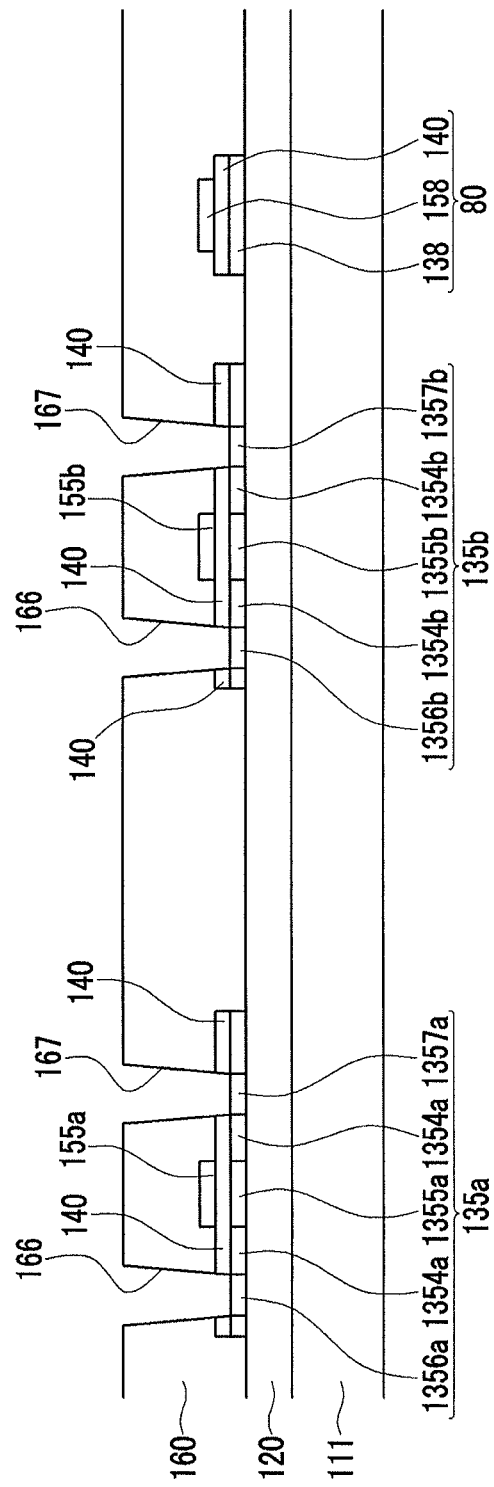

Next, as shown in FIG. 7, the first interlayer insulating layer 160 is formed on the first gate electrode 155a, the second gate electrode 155b, and the second capacitor electrode 158th.

Thereafter, by etching the first interlayer insulating layer 160 and the gate insulating layer 140, the contact holes 166 and 167 that expose the first semiconductor 135a and the second semiconductor 135b are formed, and by etching the first interlayer insulating layer 160, a contact hole (not shown) that exposes the second gate electrode 155b is formed.

Thereafter, by doping impurities in the first semiconductor 135a and the second semiconductor 135b that are exposed through the contact holes 166 and 167, the source area 1356a and 1356b and the drain area 1357a and 1357b are formed. In this case, doping may be performed in the first semiconductor 135a and the second semiconductor 135b using a photosensitive film pattern for forming the contact holes 166 and 167 as a mask or after removing a photosensitive pattern film, doping may be performed.

In this way, because doping is performed through the contact holes 166 and 167, a plane pattern of the source area 1356a and 1356b and the drain area 1357a and 1357b is the same as a plane pattern of the contact holes 166 and 167. A boundary line of the source areas 1356a and 1356b and the drain areas 1357a and 1357b corresponds with a boundary line of the contact holes 166 and 167 or positions within a boundary line of the contact holes 166 and 167.

Because the contact holes 166 and 167 are positioned apart by a predetermined distance for insulation from the first gate electrode 155a and the second gate electrode 155b, offset areas 1354a and 1354b are formed between the source areas 1356a and 1356b and the channel areas 1355a and 1355b.

A heat treatment process for activating impurities of the source areas 1356a and 1356b and the drain areas 1357a and 1357b may be added, and in this case, conductive impurities of the source areas 1356a and 1356b and the drain areas 1357a and 1357b are partially spread to the offset areas 1354a and 1354b, and thus the offset areas 1354a and 1354b may include conductive impurities.

Figure 8:
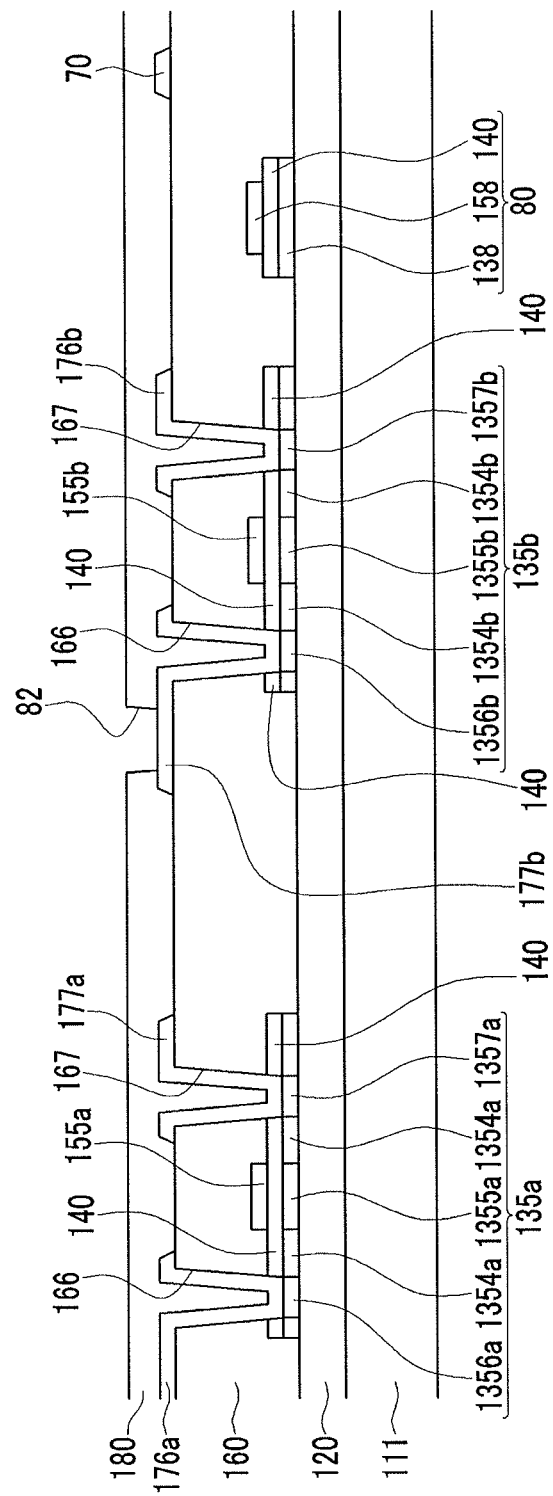

Next, as shown in FIG. 8, by forming and patterning the metal layer on the first interlayer insulating layer 160, the data line 171 having the first source electrode 176a, the driving voltage line 70 having the second source electrode 176b, the first drain electrode 177a, and the second drain electrode 177b that are connected to the source areas 1356a and 1356b and the drain areas 1357a and 1357b, respectively, through the contact holes 166 and 167 are formed.

The second interlayer insulating layer 180 is formed on the data line 171 having the first source electrode 176a, the driving voltage line 70 having the second source electrode 176b, the first drain electrode 177a, and the second drain electrode 177b.

Thereafter, by etching the second interlayer insulating layer 180, the contact hole 82 that exposes the second drain electrode 177b is formed.

Next, as shown in FIG. 3, by forming and patterning the metal layer on the second interlayer insulating layer 180, the first electrode 710 is formed.

The pixel defining layer 190 having the opening 195 is formed on the first electrode 710, the organic emission layer 720 is formed within the opening 195 of the pixel defining layer 190, and the common electrode 730 is formed on the organic emission layer 720.

In the foregoing exemplary embodiment, by doping impurity ions through a contact hole, a source area and a drain area were formed.

Therefore, a plane pattern of the source area and the drain area is the same as that of the contact hole. A boundary line of the source area and the drain area corresponds with that of the contact hole or positions within the boundary line of the contact hole.

Figure 9:
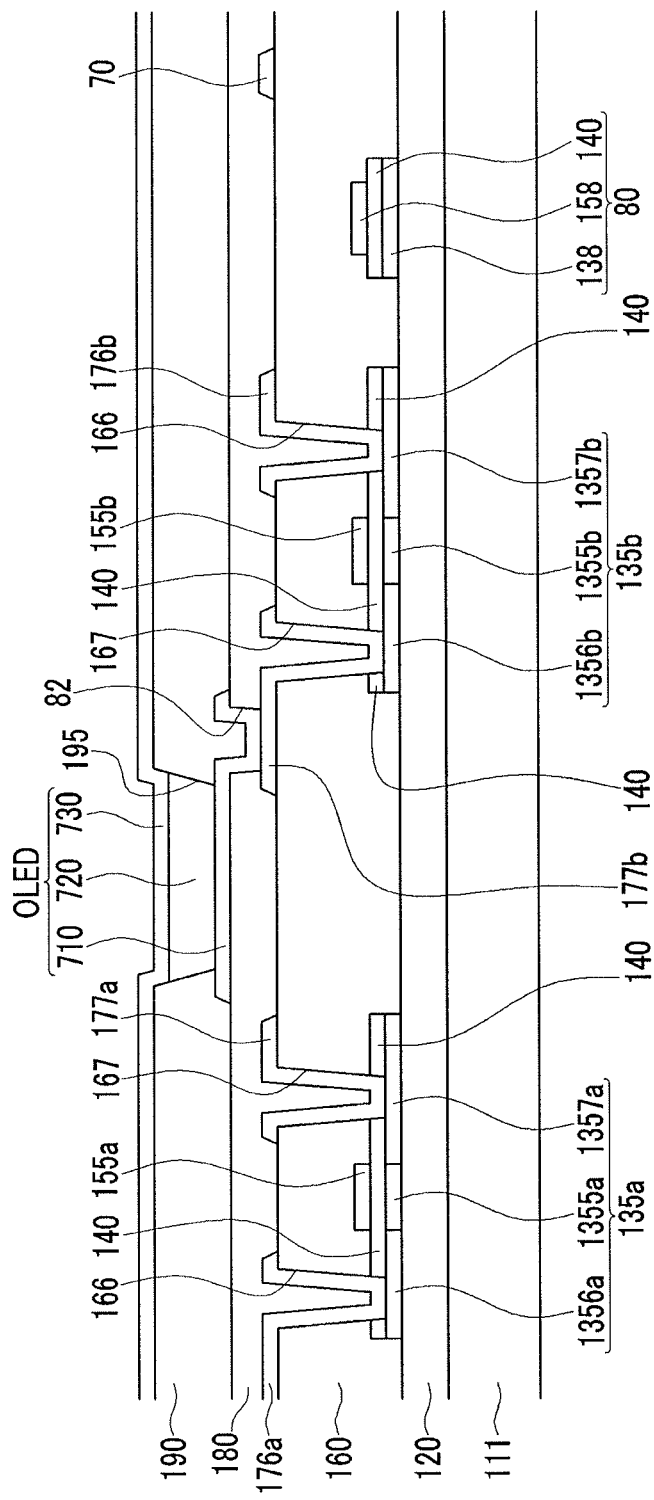
FIG. 9 is a cross-sectional view illustrating a method of manufacturing an OLED display.

However, as shown in FIG. 9, a plane pattern of a source area and a drain area may be different from that of the contact hole.

The source area and the drain area of the OLED display of FIG. 9 may be formed in an entire area that does not overlap with the first gate electrode and the second gate electrode.

FIG. 9 is a cross-sectional view illustrating a method of manufacturing an OLED display, and the method of manufacturing an OLED display will be described in detail with reference to FIGS. 10 and 11.

Figure 10:
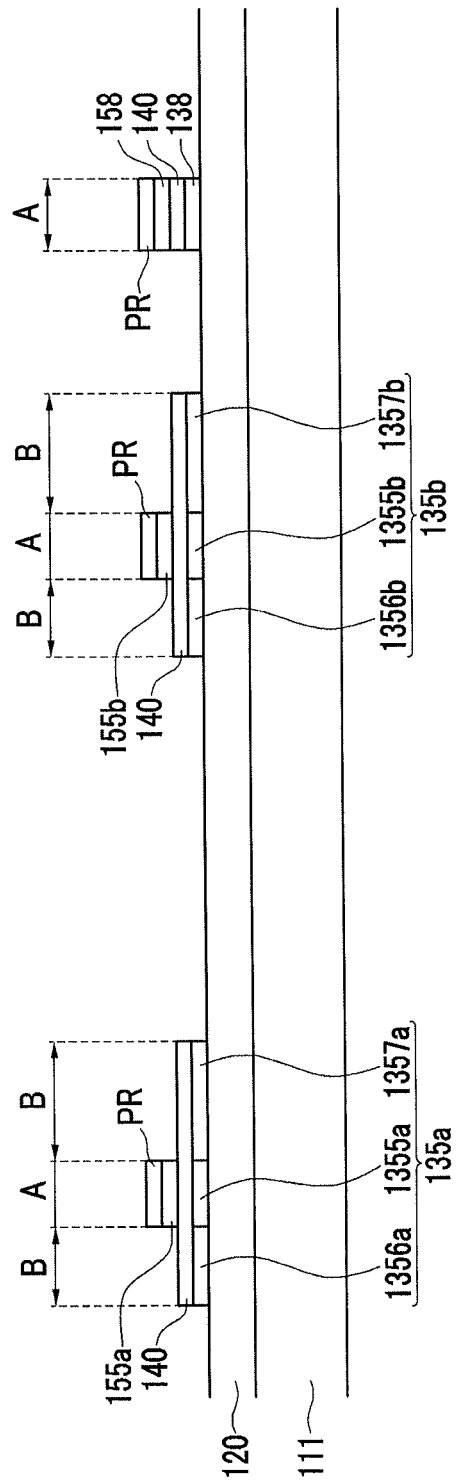
FIGS. 10 and 11 are cross-sectional views illustrating intermediate step of a method of manufacturing an OLED display according to another exemplary embodiment.
Figure 11:
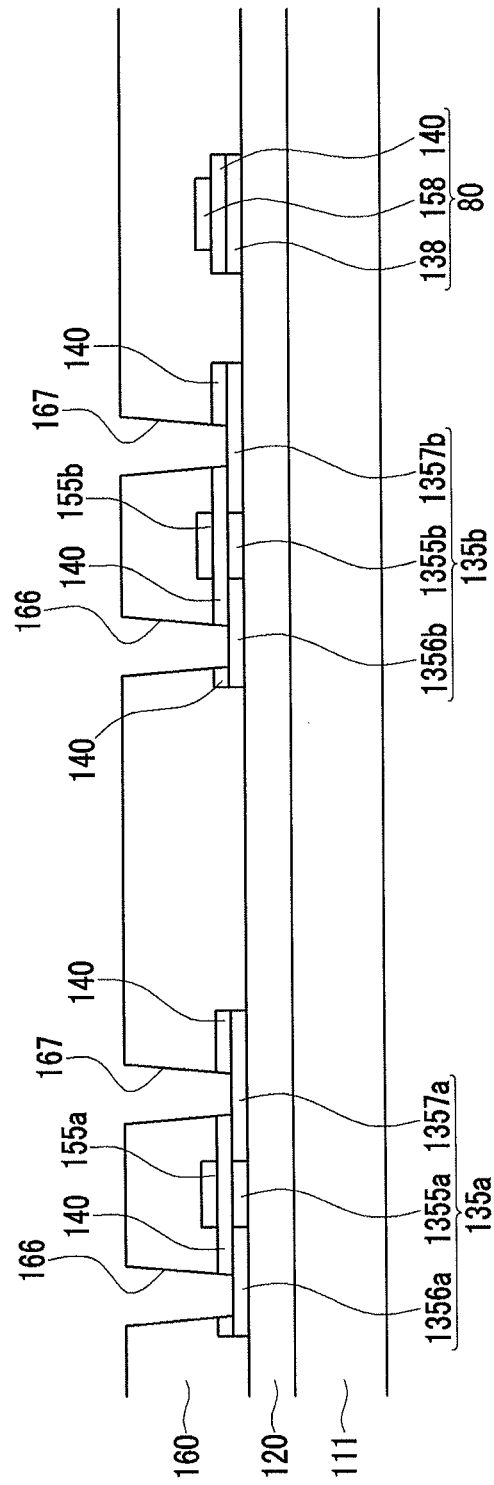

FIGS. 10 and 11 are cross-sectional views illustrating intermediate step of a method of manufacturing an OLED display according to another exemplary embodiment.

First, as shown in FIG. 4, a buffer layer 120 is formed on a substrate 111. The buffer layer 120 is made of, e.g., silicon nitride or silicon oxide.

By forming and crystallizing an amorphous silicon layer on the buffer layer 120, a polysilicon layer 30 is formed, and an insulating layer 40 and a metal layer 50 are stacked on the polysilicon layer 30. The insulating layer 40 is made of, e.g., silicon nitride or silicon oxide.

The metal layer 50 is formed by, e.g., stacking W, Cu, Al, or alloys thereof in a single layer or a plurality of layers. Thereafter, by applying, exposing, and developing a photosensitive material on the metal layer 50, a photosensitive film pattern PR of different thicknesses is formed. The photosensitive film pattern includes an electrode portion corresponding to a metal layer, an insulating layer, and a polysilicon layer of an electrode area A in which a gate electrode is to be formed and the remaining portion corresponding to the remaining area B, except for the electrode portion.

In the photosensitive film pattern PR, a photosensitive film pattern PR that is positioned at the electrode area A has a thickness larger than a photosensitive film pattern that is positioned at the remaining area B.

In this way, various methods of differently forming a thickness of the photosensitive film pattern according to a position may exist, and a method of forming a transparent area, a light blocking area, and a semi-transparent area in an exposure mask is an example. In the semi-transparent area, a thin film having a slit pattern, a lattice pattern, an intermediate transmittance, or an intermediate thickness is formed. When the slit pattern is used, a width of a slit or a gap between slits may be smaller than a resolution of an exposer using in a photolithography process. Another example is to use a photosensitive film in which reflow is available. That is, after forming a photosensitive film pattern that can reflow with a common mask having only a transparent area and a light blocking area, by enabling the photosensitive film to flow by reflow to an area in which a photosensitive film does not remain, a thin portion is formed.

Next, as shown in FIG. 5, by etching the metal layer 50, the insulating layer 40, and the polysilicon layer 30 using a photosensitive film pattern PR as a mask, a metal pattern 302, a gate insulating layer 140, a first semiconductor 135a, a second semiconductor 135b, and a first capacitor electrode 138 are formed.

The metal layer 50 is etched by wet etching, and the insulating layer 40 and polysilicon layer 30 are etched by dry etching. In this case, when the metal layer 50 is formed in a single layer or a plurality of layers including Ti or Al that can perform dry etching, the metal layer 50, the insulating layer 40, and the polysilicon layer 30 are etched at one time by dry etching.

Next, as shown in FIG. 6, the remaining portion B of the photosensitive film pattern is removed with a method of etch back. In this case, the electrode portion A is partially removed and thus a thickness and a width of the photosensitive film pattern PR decrease.

Thereafter, by etching a metal pattern using the electrode portion A as a mask, a first gate electrode 155a, a second gate electrode 155b, and a second capacitor electrode 158 are formed.

Next, as shown in FIG. 10, by doping conductive impurities in the first semiconductor 135a and the second semiconductor 135b using the electrode portion A that is exposed as a mask, source areas 1356a and 1356b and drain areas 1357a and 1357b are formed.

When removing the remaining portion, a width of the photosensitive film pattern PR that is positioned at the electrode area A is reduced, and a width of the electrode portion A may be formed to be larger than that of the first gate electrode and the second gate electrode based on the reduced width of the photosensitive film pattern. When the width of the electrode portion A is not largely formed, a width of the first gate electrode and the second gate electrode is small and thus electricity can flow due to impurity ions of a source area and a drain area and doping can be thus performed with weak energy.

Next, as shown in FIG. 11, after the electrode portion A is removed, a first interlayer insulating layer 160 having contact holes 166 and 167 is formed on the first gate electrode, the second gate electrode, and the second capacitor electrode.

Thereafter, as shown in FIG. 8, after the metal layer is formed on the first interlayer insulating layer, by forming and patterning the metal layer on the first interlayer insulating layer, the data line 171 having a first source electrode 176a a driving voltage line 70 having a second source electrode 176b, and a first drain electrode 177a, and a second drain electrode 177b that are connected to the source area and the drain area, respectively through a contact hole are formed.

A second interlayer insulating layer 180 is formed on the data line 171 having the first source electrode 176a, the driving voltage line 70 having the second source electrode 176b, the first drain electrode 177a, and the second drain electrode 177b.

Thereafter, by etching the second interlayer insulating layer 180, a contact hole 82 that exposes the second drain electrode 177b is formed.

Next, as shown in FIG. 9, by forming and patterning the metal layer on the second interlayer insulating layer 180, a first electrode 710 is formed.

A pixel defining layer 190 having an opening 195 is formed on the first electrode 710, an organic emission layer 720 is formed within the opening 195 of the pixel defining layer 190, and a common electrode 730 is formed on the organic emission layer 720.

By way of summation and review, an OLED display may be manufacturing by a photolithography process using a plurality of masks. However, as the number of times mask processes are performed increases, a process time and a process production cost also increases. The described technology to an organic light emitting diode (OLED) display, a thin film transistor array panel, and a method of manufacturing the same. For example, the described technology relates to providing a TFT array panel, a method of manufacturing the same, and an OLED display including the same being capable of reducing a process time and a process production cost of the OLED display by reducing a mask process. In this regard, when manufacturing a TFT array panel with a method of the described technology, the process number of times is reduced and thus a process production cost and time can be shortened.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a TFT array panel, the method comprising: stacking a polysilicon layer, an insulating layer, and a metal layer on a substrate; forming a photosensitive film pattern having a first portion and a second portion having a thickness smaller than that of the first portion on the metal layer; forming a metal pattern, a gate insulating layer, and a semiconductor by etching the metal layer, the insulating layer, and the polysilicon layer using the photosensitive film pattern as a mask; forming a gate electrode by removing the second portion of the photosensitive film pattern and by etching the metal pattern using the first portion as a mask; removing the first portion of the photosensitive film pattern; forming an interlayer insulating layer on the gate electrode; forming contact holes that expose the semiconductor in the interlayer insulating layer; forming a source area and a drain area by doping semiconductor conductive impurities through the contact holes, respectively; and forming a source electrode and a drain electrode that are connected to the source area and the drain area, respectively, on the interlayer insulating layer.

2. The method of claim 1, wherein at the forming of a metal pattern,
the metal layer is wet etched, and
the insulating layer and they polysilicon layer are dry etched.

3. The method of claim 1, wherein the metal layer is formed in a triple layer of Ti/Al/Ti, wherein at the forming of a metal pattern, the metal layer, the insulating layer, and the polysilicon layer are dry etched.

4. A method of manufacturing a TFT array panel, the method comprising: stacking a polysilicon layer, an insulating layer, and a metal layer on a substrate; forming a photosensitive film pattern having a first portion and a second portion having a thickness smaller than that of the first portion on the metal layer; forming a metal pattern, a gate insulating layer, and a semiconductor by etching the metal layer, the insulating layer, and the polysilicon layer using the photosensitive film pattern as a mask; forming a gate electrode by removing the second portion of the photosensitive film pattern and by etching the metal pattern using the first portion of the photosensitive film pattern as a mask; removing the first portion of the photosensitive film pattern; forming an interlayer insulating layer on the gate electrode; forming contact holes that expose the semiconductor in the interlayer insulating layer; and forming a source electrode and a drain electrode that are connected to the source area and the drain area, respectively, on the interlayer insulating layer, wherein before or after the removing of the first portion, the method further includes doping conductive impurities in the semiconductor.

5. The method of claim 4, wherein at the forming of a metal pattern, the metal layer is wet etched and the insulating layer and the polysilicon layer are dry etched.

6. The method of claim 4, wherein:
the metal layer is formed in a triple layer of Ti/Al/Ti, and
at the forming of a metal pattern, the metal layer, the insulating layer, and the polysilicon layer are dry etched.

\* \* \* \* \*